United States Patent
Wang et al.

[11] Patent Number: 6,124,166
[45] Date of Patent: Sep. 26, 2000

[54] METHOD OF FORMING A LOWER ELECTRODE OF A CAPACITOR IN A DRAM CELL

[75] Inventors: Chuan-Fu Wang, San-Chung; Der-Yuan Wu, Hsin-Chu, both of Taiwan

[73] Assignee: United Microelectronics Corp., Hsin-Chu, Taiwan

[21] Appl. No.: 09/340,401

[22] Filed: Jun. 28, 1999

[51] Int. Cl.$^7$ .............................................. H01L 21/8242
[52] U.S. Cl. ........................................... 438/255; 439/398
[58] Field of Search .................... 438/253–256, 438/238, 396–399, 381

[56] References Cited

U.S. PATENT DOCUMENTS 6,037,219  3/2000  Lin et al. ................................ 438/255
6,037,220  3/2000  Chien et al. ............................. 438/255

*Primary Examiner*—Jey Tsai
*Attorney, Agent, or Firm*—Winston Hsu

[57] ABSTRACT

The present invention relates to a method of forming a lower electrode of a capacitor on a DRAM cell in a semiconductor wafer for increasing a surface area of the lower electrode. It is achieved by forming a second dielectric layer on a first polysilicon layer which comprises a plurality of doped horizontal layers along a vertical direction. Because dopant densities of the doped horizontal layers alternate in a high and low sequence, when forming a second polysilicon layer on the second dielectric layer, the second polysilicon layer will have many hemispherical grains on the vertical side wall of the second dielectric layer. This will result in an increased surface area of the lower electrode.

6 Claims, 6 Drawing Sheets

METHOD OF FORMING A LOWER ELECTRODE OF A CAPACITOR IN A DRAM CELL

BACKGROUND OF THE INVENTION

1. Field of the Invention

The present invention relates to a lower electrode of a capacitor, and more particularly, to a method of forming a lower electrode of a capacitor in a DRAM cell in a semiconductor wafer.

2. Description of the Prior Art

In a semiconductor process, the dynamic random access memory (DRAM) is a combination of a large number of DRAM cells. A metal oxide semiconductor (MOS) in series with a capacitor constitute the DRAM cell. The design of the capacitor of the DRAM cell involves installing two conductive layers and an insulating layer on a semiconductor wafer. The two conductive layers act as the upper and lower electrodes, respectively, and the insulating layer separates the two electrodes. When a predetermined voltage is applied to the two electrodes, charges are stored in the two electrodes and a capacitance is generated. With advancement of semiconductor processing technology, the volume of the DRAM cell is smaller. Problems arise since the reduction of the DRAM cell volume causes a proportionate decrease in capacitance. Therefore, how to increase the capacitance of the capacitor in the reduced-volume DRAM cell is a very important issue.

Please refer to FIG.1 to FIG.6. FIG.1 to FIG.6 are perspective views of the method of forming a lower electrode 25 of a stack crown capacitor on a DRAM cell. As shown in FIG.1, the semiconductor wafer 10 comprises a Si substrate 12, a first dielectric layer 14 positioned on the Si substrate 12, and a polysilicon layer 18 positioned on the first dielectric layer 14 and completely filling the contact hole 16. A contact hole 16 extends down to the Si substrate.

In the formation of the lower electrode 25 of the capacitor, the second dielectric layer 22 made of silicon oxide is formed on the surface of the first polysilicon layer 18, as shown in FIG.2. Then, an isotropic dry etching process is performed to form a dielectric block containing a vertical side wall on a predetermined region above the contact hole 16, as shown in FIG.3. Next, a second polysilicon layer 24 is deposited on the surface of the second dielectric layer 22 and the first dielectric layer 18, as shown in FIG.4. Then, an etching back process is performed to remove the second polysilicon layer 24 and the first dielectric layer 18 from the first dielectric layer 14 in a vertical direction while preserving the second polysilicon layer 24 on the vertical side wall of the second dielectric layer 22, as shown in FIG.5. Lastly, a wet etching process is performed to remove the second dielectric layer 22. The first polysilicon layer 18 and the second polysilicon layer 24 remaining on the contact hole 16 are used as the lower electrode of the capacitor 25, as shown in FIG.6.

Since the surface area of the lower electrode 25 of the capacitor is larger in the current technology, the capacitance of the capacitor can be higher and the information in the DRAM cell will not be lost by the leakage current. To prevent reduction of capacitance from the reduced volume of the DRAM cell, the surface area of the lower electrode 25 can be increased. This will increase the capacitance of the capacitor.

SUMMARY OF THE INVENTION

It is therefore a primary objective of the present invention to provide a method of forming a lower electrode of a capacitor on a DRAM cell in a semiconductor wafer to solve the above mentioned problem.

In a preferred embodiment, the present invention relates to a method of forming a lower electrode of a capacitor on a DRAM cell in a semiconductor wafer, the semiconductor wafer comprising:

a Si substrate;

a first dielectric layer positioned on the Si substrate, the dielectric layer comprising a contact hole extending down to the Si substrate; and a first polysilicon layer positioned on the first dielectric layer and completely filling the contact hole;

the method comprising:

forming a second dielectric layer on the first polysilicon layer which comprises a plurality of doped horizontal layers along a vertical direction, and the dopant densities of the plurality of doped horizontal layers being alternatively in a high and low sequence;

performing a dry etching process to the second dielectric layer to form a dielectric block on the second dielectric layer above the contact hole, the periphery of the dielectric block containing a vertical side wall;

forming a second polysilicon layer on the semiconductor wafer, the second polysilicon layer formed on the vertical side wall of the dielectric block comprising many hemispheric grains due to the different dopant densities of the plurality of doped horizontal layers in the dielectric block;

performing an etching back process to vertically remove the second polysilicon layer on top of the dielectric block and on the first dielectric layer outside the dielectric block while maintaining the second polysilicon layer on the vertical side wall; and performing a wet etching process to remove the dielectric block wherein the first polysilicon layer on the contact hole and the remaining second polysilicon is used as the lower electrode of the capacitor.

It is an advantage of the present invention that the surface area of the lower electrode of the capacitor in the present invention has higher capacitance for a given volume as compared to other capacitors.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
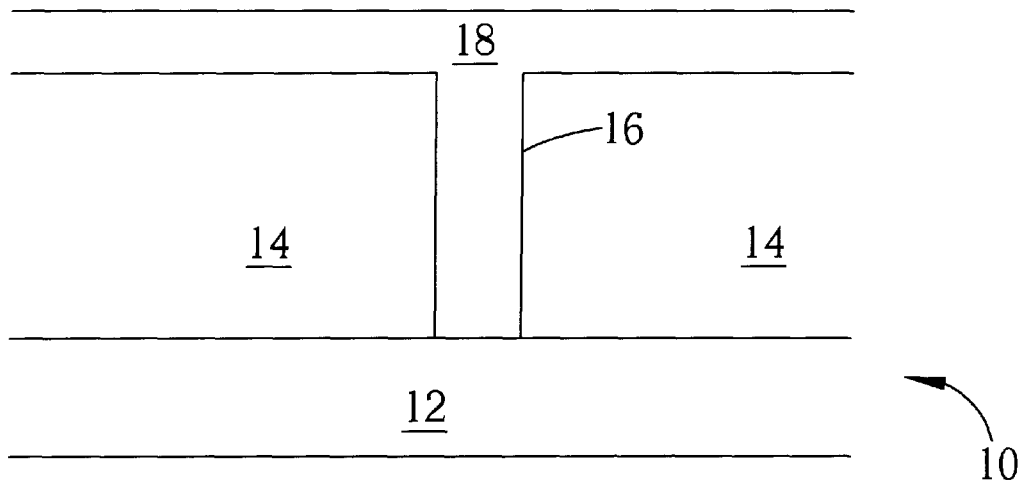
FIG. 1 to FIG. 6 are perspective views of the prior art method of forming a lower electrode 25 of a stack crown capacitor on a DRAM cell.
Figure 2:
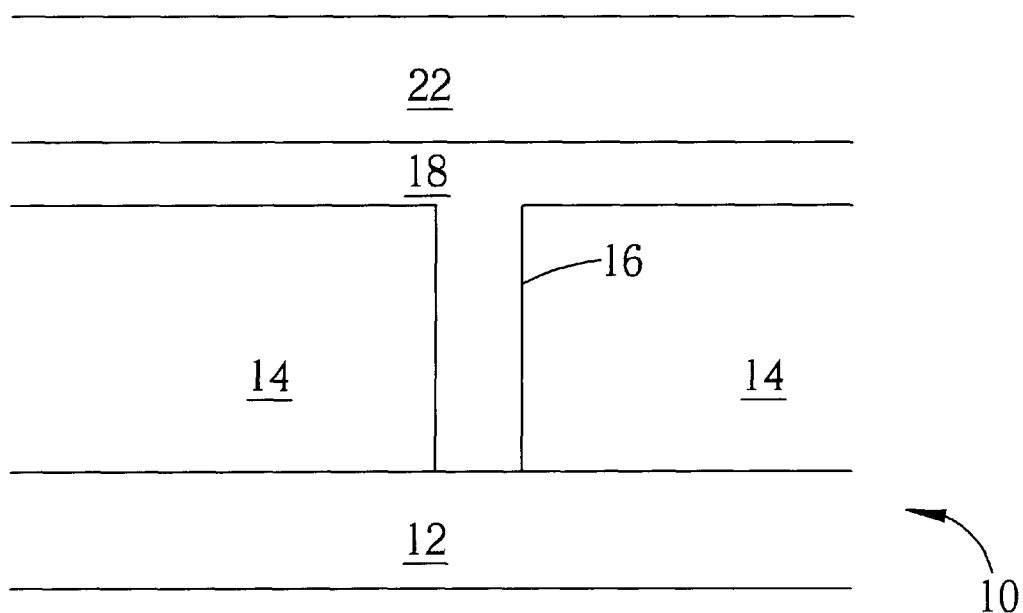
Figure 3:
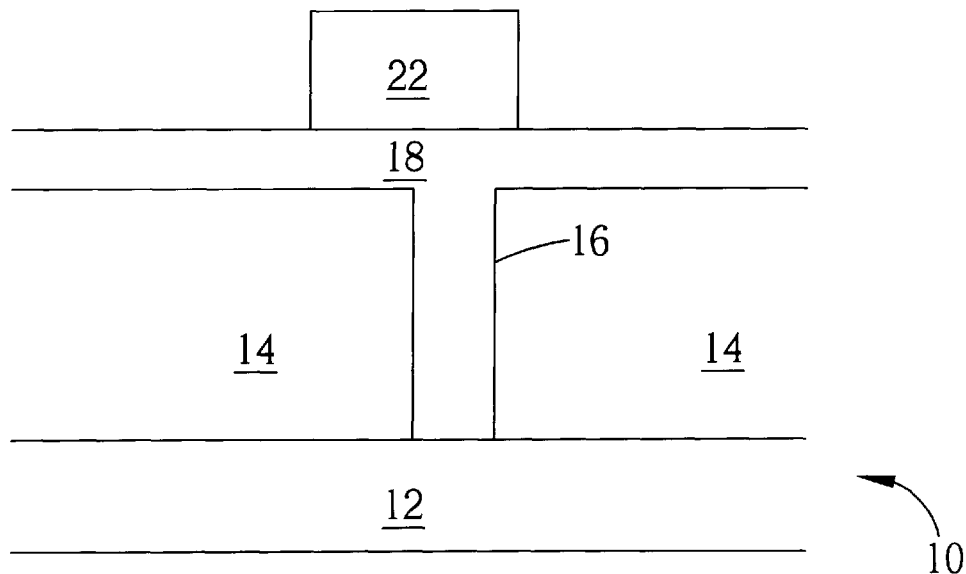
Figure 4:
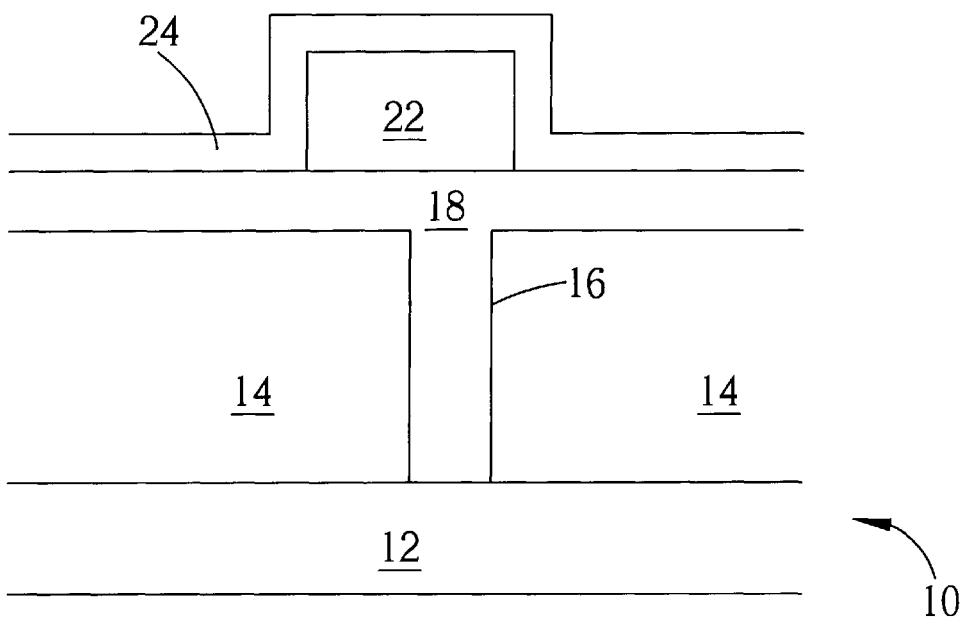
Figure 5:
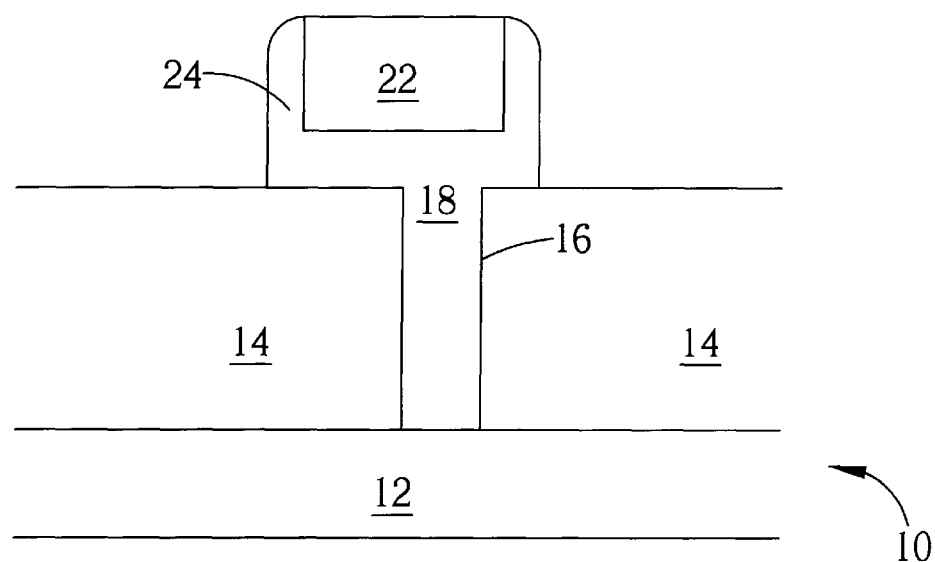
Figure 6:
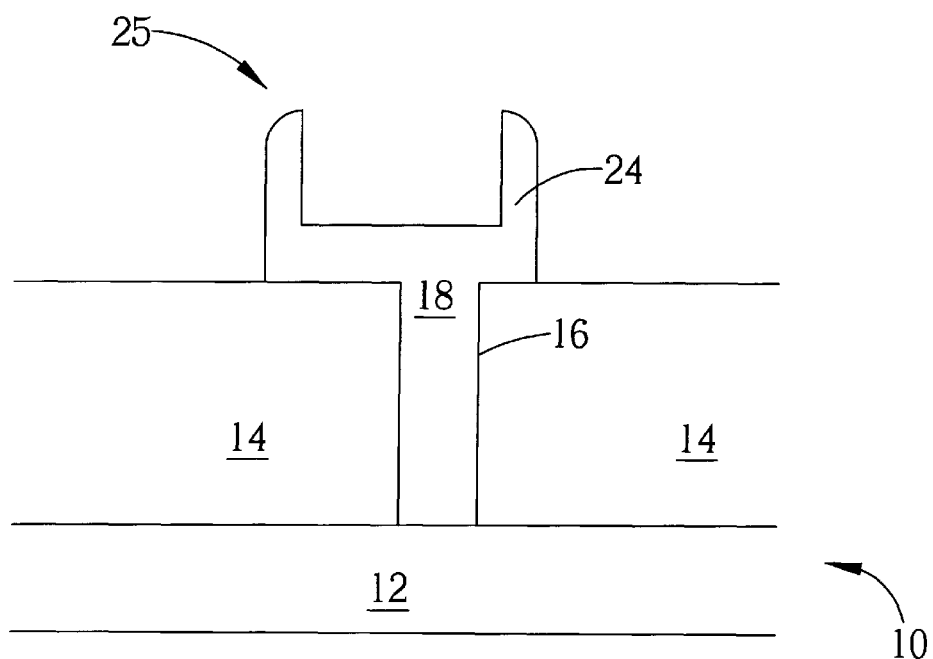
Figure 7:
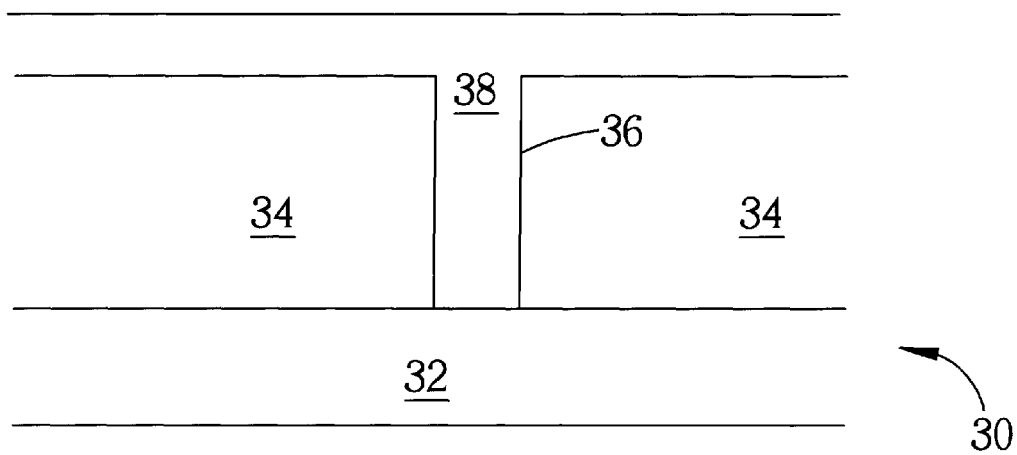
FIG. 7 to FIG. 12 are perspective views of the method of forming a lower electrode 25 of a stack crown capacitor on a DRAM cell according to the present invention.

Please refer to FIG. 7 to FIG. 12. FIG. 7 to FIG. 12 are perspective views of the method of forming a lower electrode 46 of a stack crown capacitor on a DRAM cell according to the present invention. The formation of the lower electrode 46 is performed on a semiconductor wafer 30. As shown in FIG.7, the semiconductor wafer 30 comprises a Si substrate 32, a first dielectric layer 34 positioned on the Si substrate 32, the first dielectric layer 34 comprising a contact hole 36 extending down to the Si substrate 32, and a first polysilicon layer 38 positioned on the first dielectric layer 34 and completely filling the contact hole 36.

Figure 8:
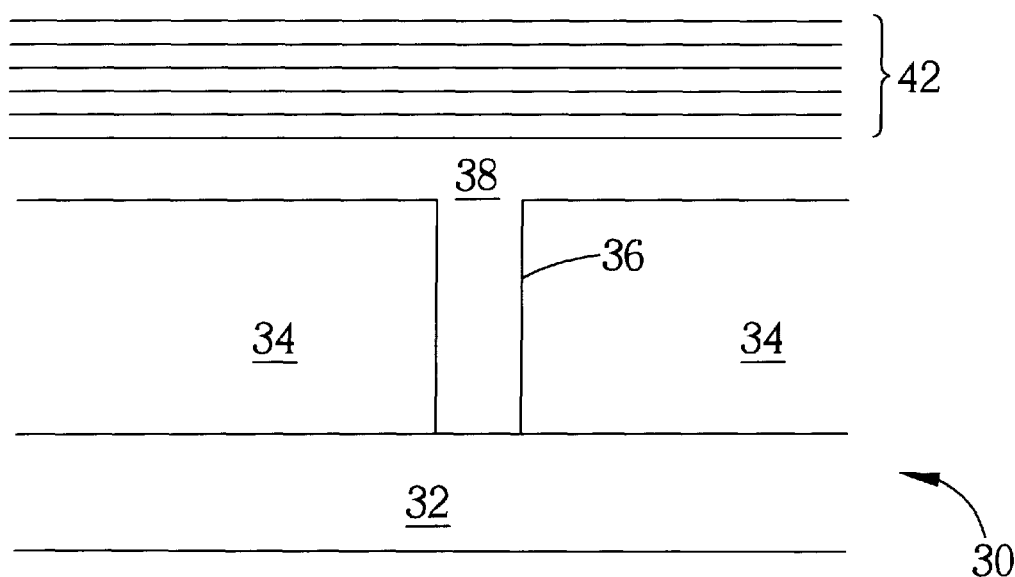
Figure 9:
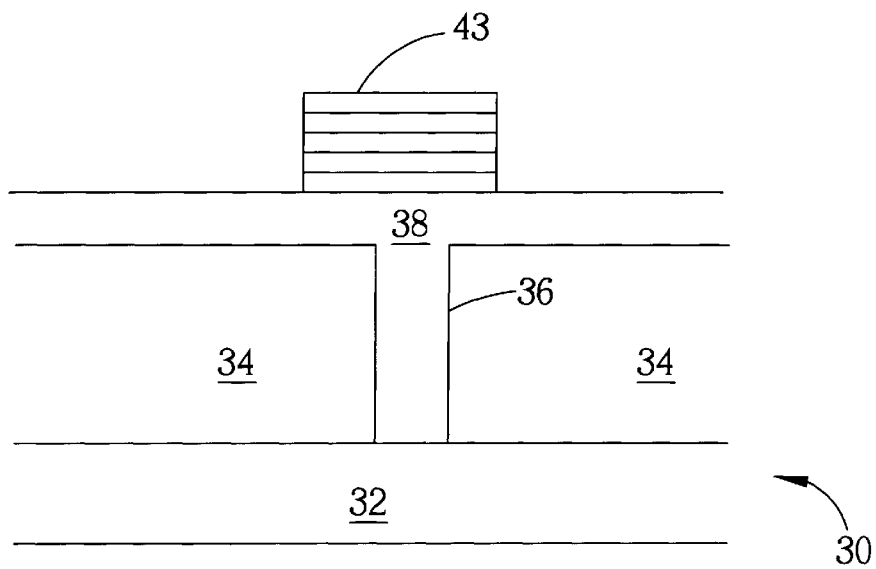

In the formation of the lower electrode 46, a second dielectric layer 42 is formed on the first dielectric layer 38 which comprises a plurality of doped horizontal layers along a vertical direction. The dopant densities of the doped horizontal layers are such that high density doped layers alternate with low density doped layers, as shown in FIG. 8. Then, a dry etching process is performed to form a circular dielectric block 43 on the second dielectric layer 42 above the contact hole 26, the periphery of the circular dielectric block 43 contains a vertical side wall, as shown in FIG. 9.

Figure 10:
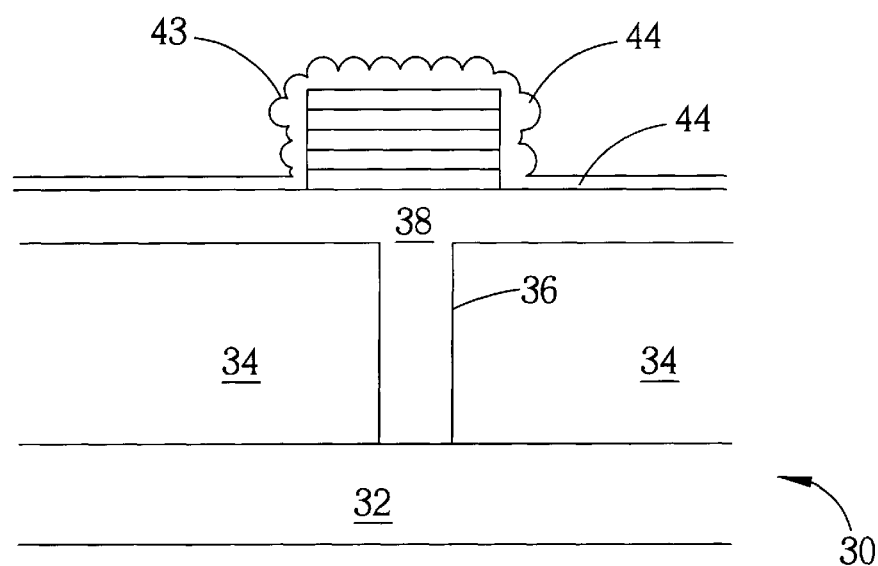
Figure 11:
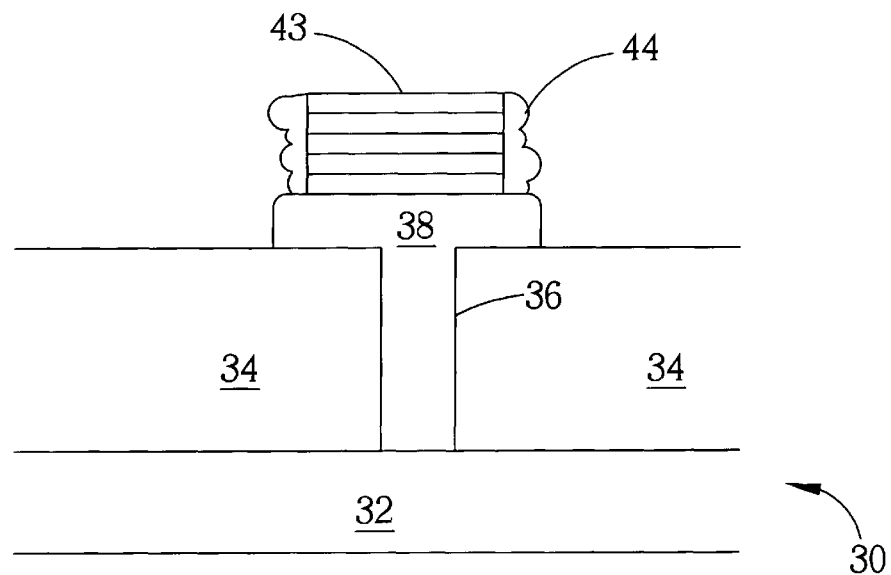
Figure 12:
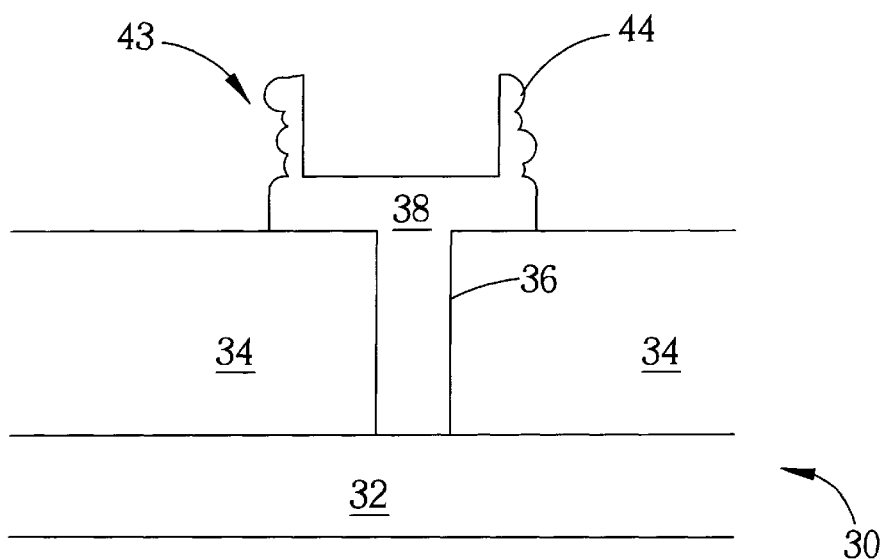

Next, by utilizing a hemi-sphere grain process, a second polysilicon layer 44 is formed on the semiconductor wafer 30. The second polysilicon layer 44 formed on the vertical side wall of the dielectric block 43 comprises many hemispheric grains due to the different dopant densities of the plurality of doped horizontal layers in the dielectric block 43, as shown in FIG. 10. After that, an etching back process is performed to remove the second polysilicon layer 44 from the top of the dielectric block 43 and on the first dielectric layer 34 outside the dielectric block 43 in a vertical direction while maintaining the second polysilicon layer 44 on the vertical side wall, as shown in FIG. 11. Lastly, a wet etching process is performed to remove the dielectric block 43 wherein the first polysilicon layer 38 on the contact hole 26 and the remaining second polysilicon layer 44 is used as the lower electrode 46 of the capacitor, as shown in FIG. 12.

There are two methods of formation of the second dielectric layer 42. One method involves using a chemical vapor deposition method, wherein the different dopant densities of the plurality of doped horizontal layers along the vertical direction are formed by injecting different amounts of gaseous dopants at different time intervals. Another method involves using a chemical vapor deposition method to form an undoping dielectric layer at a predetermined thickness. Multiple ion implantations in the second dielectric layer 42 is performed to produce the different dopant densities of the plurality of doped horizontal layers along the vertical direction of the second dielectric layer 42.

The second dielectric layer 42 comprises a plurality of doped horizontal layers along a vertical direction and the dopant densities of the plurality of doped horizontal layers alternate high density/low density. Therefore, during the hemisphere grain process, the second polysilicon layer 44 formed on the vertical side wall of the dielectric block 43 contains many hemispheric grains due to the different dopant densities of the plurality of doped horizontal layers in the dielectric block 43. So, the surface area of the second polysilicon layer 44 increases as does the lower electrode 46.

In contrast to the prior art method, the method of forming a lower electrode 46 of a capacitor on a DRAM cell according to the present invention involves first forming a second dielectric layer 42 on the first polysilicon layer 38. The second dielectric layer 42 comprises a plurality of doped horizontal layers along a vertical direction, the dopant densities of which alternate high density/low density. The second polysilicon layer 44 is formed on the vertical side wall of the dielectric block comprising many hemispheric grains due to the different dopant densities of the plurality of doped horizontal layers in the dielectric block 43. This increases the surface of the lower electrode 46. Compared with the other capacitors of the same volume, the present invention lower electrode 46 of the capacitor has a higher capacitance.

What is claimed is:

1. A method of forming a lower electrode of a capacitor on a DRAM cell in a semiconductor wafer, the semiconductor wafer comprising:

a Si substrate;

a first dielectric layer positioned on the Si substrate, the dielectric layer comprising a contact hole extending down to the Si substrate; and a first polysilicon layer positioned on the first dielectric layer and completely filling the contact hole;

the method comprising:

forming a second dielectric layer on the first polysilicon layer which comprises a plurality of doped horizontal layers along a vertical direction, and the dopant densities of the plurality of doped horizontal layers being alternatively in a high and low sequence;

performing a dry etching process to the second dielectric layer to form a dielectric block on the second dielectric layer above the contact hole, the periphery of the dielectric block containing a vertical side wall;

forming a second polysilicon layer on the semiconductor wafer, the second polysilicon layer formed on the vertical side wall of the dielectric block comprising many hemispheric grains due to the different dopant densities of the plurality of doped horizontal layers in the dielectric block;

performing an etching back process to vertically remove the second polysilicon layer on top of the dielectric block and on the first dielectric layer outside the dielectric block while maintaining the second polysilicon layer on the vertical side wall; and performing a wet etching process to remove the dielectric block wherein the first polysilicon layer on the contact hole and the remaining second polysilicon layer is used as the lower electrode of the capacitor.

2. The method of claim 1 wherein the main ingredient of the second dielectric layer is silicon oxide.

3. The method of the claim 1 wherein the second dielectric layer is formed by using a chemical vapor deposition method.

4. The method of claim 3 wherein when forming the second dielectric layer, the different dopant densities of the plurality of doped horizontal layers along the vertical direction are formed by injecting different amounts of gaseous dopants in different time intervals.

5. The method of claim 1 wherein the different dopant densities of the plurality of doped horizontal layers along the vertical direction of the second dielectric layer are formed by performing multiple ion implantations to the second dielectric layer.

6. The method of claim 1 wherein the dielectric block is a circular block having a circular periphery.

* * * * *